US009397654B2

(12) United States Patent
Lou

(10) Patent No.: US 9,397,654 B2
(45) Date of Patent: Jul. 19, 2016

(54) LOW POWER EXTERNALLY BIASED POWER-ON-RESET CIRCUIT

(71) Applicant: QUALCOMM SWITCH CORP., San Diego, CA (US)

(72) Inventor: Perry Lou, Carlsbad, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/510,989

(22) Filed: Oct. 9, 2014

(65) Prior Publication Data

US 2016/0105169 A1    Apr. 14, 2016

(51) Int. Cl.
*H03K 17/12*    (2006.01)
*H03K 17/22*    (2006.01)

(52) U.S. Cl.
CPC .................................. *H03K 17/223* (2013.01)

(58) Field of Classification Search
CPC ... H03K 17/223; H03K 17/145; H03K 17/16; H03K 3/353; H03K 5/01; H03K 5/02
USPC ......................................... 327/142, 143, 198
See application file for complete search history.

(56) References Cited

U.S. PATENT DOCUMENTS

| 4,698,531 | A | 10/1987 | Jones |
|---|---|---|---|
| 4,788,462 | A | 11/1988 | Vesce et al. |
| 4,885,476 | A | 12/1989 | Mahabadi |
| 5,321,317 | A | 6/1994 | Pascucci et al. |
| 5,345,422 | A | 9/1994 | Redwine |
| 5,469,099 | A | 11/1995 | Konishi |
| 5,534,804 | A * | 7/1996 | Woo ............. H03K 17/223 326/27 |
| 5,880,611 | A | 3/1999 | Danstrom |
| 5,929,673 | A | 7/1999 | Haigis et al. |
| 6,005,432 | A | 12/1999 | Guo et al. |
| 6,236,249 | B1 | 5/2001 | Choi et al. |
| 6,747,492 | B2 | 6/2004 | Govil et al. |
| 7,081,779 | B2 | 7/2006 | Kang |
| 7,091,758 | B2 | 8/2006 | Chun et al. |
| 7,164,300 | B2 | 1/2007 | Hsu |

(Continued)

FOREIGN PATENT DOCUMENTS

EP    0530159 B1    7/1997

OTHER PUBLICATIONS

International Search Report and Written Opinion—PCT/US2015/054548—ISA/EPO—Jan. 4, 2016.

(Continued)

*Primary Examiner* — John Poos
(74) *Attorney, Agent, or Firm* — Haynes and Boone, LLP

(57) ABSTRACT

Various methods and devices that involve power-on-reset (POR) circuits are disclosed herein. An exemplary POR circuit for generating a POR signal upon detecting that a supply voltage has reached a desired level comprises a sense circuit and a delayed buffer. The sense circuit comprises: (i) an inverter powered by a known bias voltage; (ii) a feedback circuit powered by the supply voltage; and (iii) an output node of the sense circuit that experiences a voltage transition when the supply voltage has reached the desired level. The delayed buffer is coupled to the output node of the sense circuit that generates the POR signal in response to the voltage transition. The feedback circuit shuts off the sense circuit in response to the voltage transition. The POR circuit generates the POR signal for a local system. The known bias voltage is provided by an external system.

15 Claims, 8 Drawing Sheets

(56) References Cited

U.S. PATENT DOCUMENTS

| | | |
|---|---|---|
| 7,667,489 B1 | 2/2010 | Vasudevan |
| 8,344,767 B2 | 1/2013 | Li et al. |
| 8,547,147 B2 | 10/2013 | Huang |
| 8,570,077 B2 | 10/2013 | Kwon et al. |
| 2002/0101223 A1 | 8/2002 | Sugimura |
| 2009/0206891 A1 | 8/2009 | Guimont et al. |

OTHER PUBLICATIONS

Yen W-C et al., "A Precision CMOS Power-On-Reset Circuit with Power Noise Immunity for Low-Voltage Technology," IEICE Transactions on Electronics, Institute of Electronics, Tokyo, JP, vol. E87-C, No. 5, May 1, 2004, pp. 778-784, XP001195874, ISSN: 0916-8524.

* cited by examiner

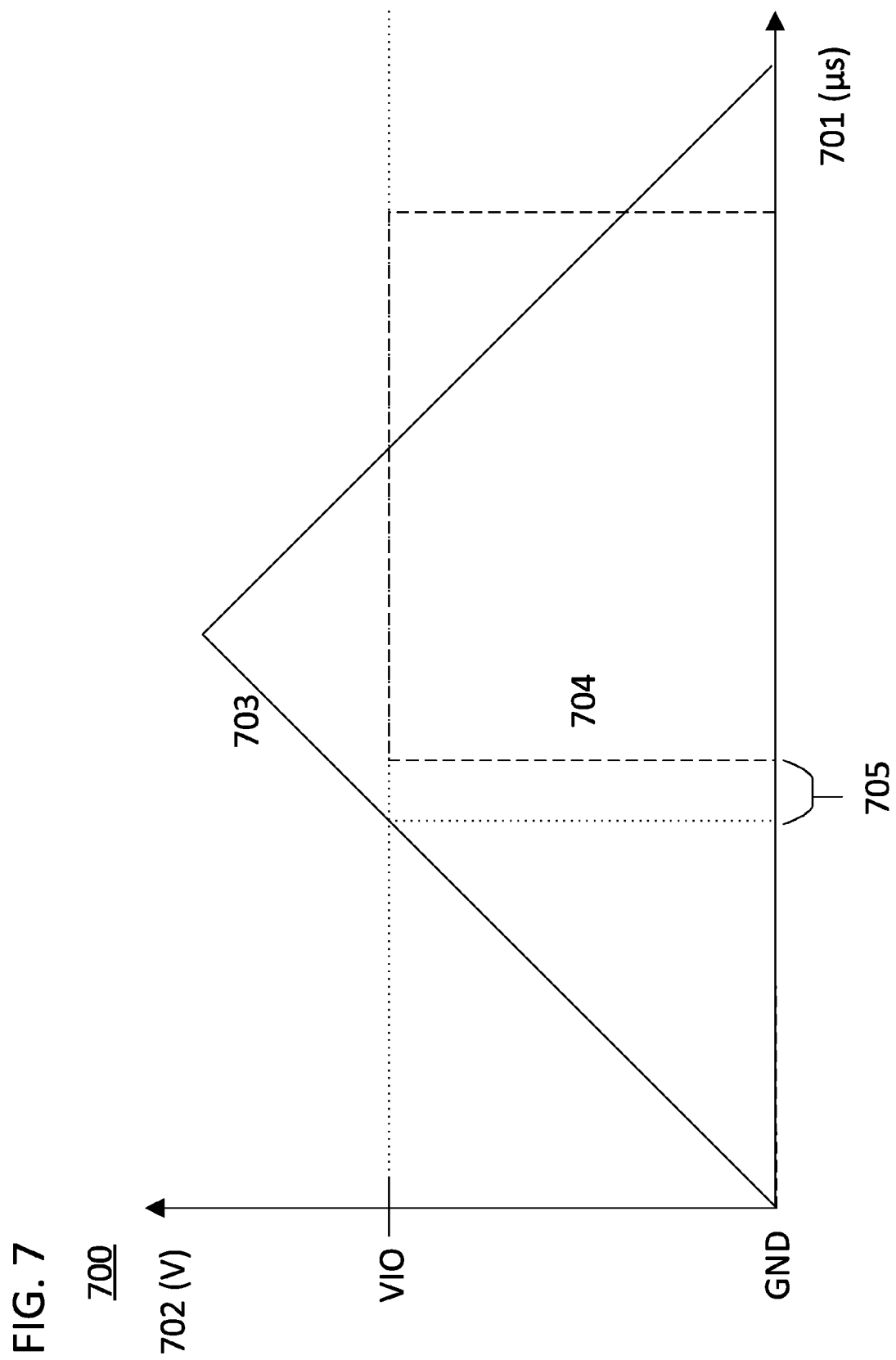

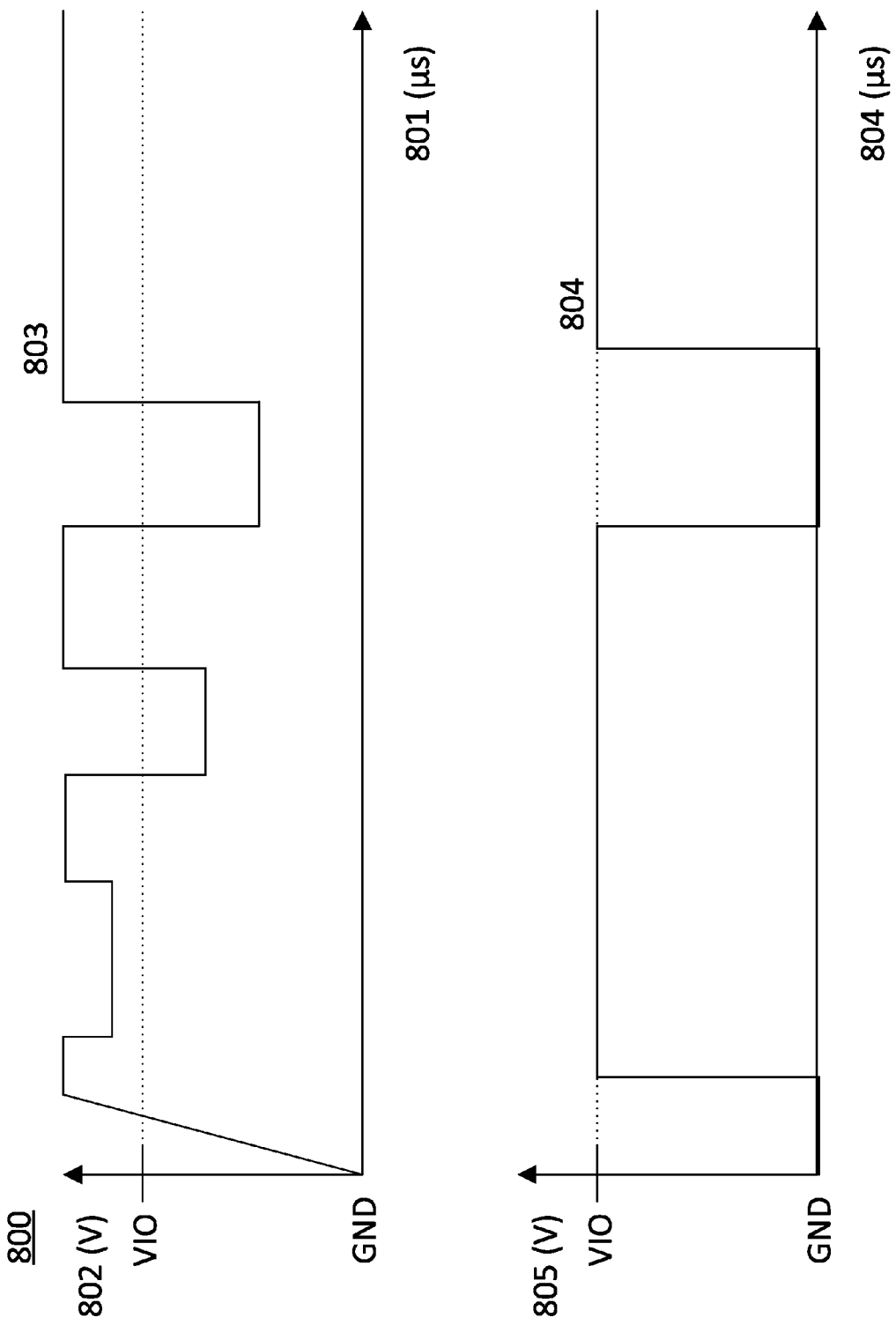

LOW POWER EXTERNALLY BIASED POWER-ON-RESET CIRCUIT

BACKGROUND OF THE INVENTION

Circuit designers need to consider a multitude of varying conditions in which their circuits must operate. One class of conditions that designers must consider involves variations in the supply voltage. Two particular variations of the supply voltage can be particularly problematic, namely, power-up transitions and brown outs. In a power-up transition, the power supply of the circuit transitions from an off state to an on state. In a brown out, the power supply of the circuit transitions temporarily to a low state from an on state. These operating conditions have the capability to place an electronic circuit into an irrecoverable glitched state and may produce other unpredictable deleterious nonlinear abnormalities in an electronic system. However, these problematic operating conditions can be screened from the concerns of a standard circuit designer through the use of a power-on-reset (POR) circuit.

POR circuits act as sub-circuits for larger systems and provide a reliable signal when the power transitions from an insufficient level to a sufficient level. Generally, the POR circuit will detect such a transition, and will produce a POR signal in response. The POR signal remains steady for a sufficient amount of time for the larger system to reach a quiescent state. As such, the larger system can use the POR signal to clear itself of any deleterious modalities during rest, and will also be able to reliably determine when decreases in the supply voltage are not severe enough for standard operations to cease and when conditions necessitate a shut down. For example, the POR circuit can force multi-state logic circuits to remain in their reset states while the power is transitioning to a stable state in order to keep the multi-state logic circuits from entering into ambiguous states that could break the logic circuit.

POR circuits are generally designed with an emphasis on power conservation and reliability. Since power is a fundamental input for an electronic system, improper performance of a POR circuit can cause an entire system to fail and be rendered entirely useless. Designing a POR circuit that operates reliably is therefore of paramount importance. At the same time, since POR circuits are responsible for determining if power is at a sufficient level for an entire system, there is no other sub-circuit that can be trusted to reliably control when the POR circuit should be operating or not. As such, POR circuits are generally designed to always be on so that they provide a reliable monitor for the power supply. However, since they are always on, the amount of power they consume is a constant tax on any system to which they are a part. The power they consume during standard operation is a particularly conspicuous waste because once the power has reached a reliable level, the POR circuit continues to draw power even though it isn't contributing anything useful to the system.

FIG. 1 illustrates a POR circuit 100 comprising sense circuit 101 and POR signal generator circuit 102. As illustrated, both circuits are powered by the supply voltage (VDD) and are tied to ground (GND). Sense circuit 101 detects when the supply voltage VDD has transitioned from an insufficient level to a sufficient level, and delivers a pulse signal to the POR signal generator circuit 102. In response, POR signal generator circuit 102 creates a pulse that serves as the POR signal.

Although circuit 100 is reliable, it comprises two open current branches, 103 and 104, from VDD to GND. In one implementation of POR circuit 100, branches 103 and 104 drew a combined nominal current of 13 micro-Amperes ($\mu A$). As mentioned, POR circuit 100 will continue to draw this current regardless of whether or not the rest of the system is active or in a stand-by state. In certain situations, this 13 $\mu A$ may be an unacceptably large value.

SUMMARY OF INVENTION

In one disclosed embodiment, a power-on-reset (POR) circuit for generating a POR signal upon detecting that a supply voltage has reached a desired level is provided. The POR circuit comprises a sense circuit and a delayed buffer. The sense circuit comprises: (i) an inverter powered by a known bias voltage; (ii) a feedback circuit powered by the supply voltage; and (iii) an output node of the sense circuit that experiences a voltage transition when the supply voltage has reached the desired level. The delayed buffer is coupled to the output node of the sense circuit that generates the POR signal in response to the voltage transition. The feedback circuit shuts off the sense circuit in response to the voltage transition. The POR circuit generates the POR signal for a local system. The known bias voltage is provided by an external system.

In another disclosed embodiment, a POR circuit is provided. The POR circuit comprises an inverter that is powered by an external power source and that outputs a signal when a supply voltage exceeds the external power source. The POR circuit also comprises a delayed buffer that is operatively coupled to an inverter output node of the inverter to receive the signal from the inverter. The POR circuit also comprises a feedback circuit. The POR circuit also comprises a voltage divider that is coupled to the supply voltage, an inverter input node of the inverter, and the feedback circuit. The feedback circuit isolates the voltage divider from ground and couples the voltage divider to the supply voltage in response to the signal. The delayed buffer generates a POR signal in response to the signal.

In another disclosed embodiment, a POR circuit comprises an inverter coupled between a known bias voltage and a ground node. The POR circuit also comprises a first transistor that is coupled between a supply voltage and an input node of the inverter and that has a first control electrode coupled to the input node of the inverter. The POR circuit also comprises a second transistor that forms a portion of a circuit branch between the first transistor and the ground node and that has a second control electrode coupled to the input node of the inverter. The POR circuit also comprises a delayed buffer that receives a transition signal from the inverter when the supply voltage exceeds the known bias voltage. The POR circuit also comprises a feedback circuit that shorts the circuit branch and pulls the input node of the inverter to the supply voltage in response to the transition signal.

BRIEF DESCRIPTION OF THE DRAWINGS

FIG. 7 illustrates a waveform plot of the performance of a POR circuit that is in accordance with embodiments of the present invention. The x-axis is in units of time and the y-axis is in units of volts.

FIG. 8 illustrates two waveform plots that illustrate the brown out performance of a POR circuit that is in accordance with embodiments of the present invention. Each x-axis is in units of time and each y-axis is in units of volts

DETAILED DESCRIPTION OF THE EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Circuits and methods that provide a reliable power on reset (POR) signal to an electronic system are disclosed. The POR signal can serve as a guaranteed reset-state signal during power-up of the system's supply voltage (VDD). Some of the disclosed circuits also consume minimal supply current in normal steady-state conditions after power-up of VDD. Some of the disclosed circuits also utilize a known bias voltage provided by a secondary supply (VIO). The known bias voltage can be provided by an external source and may or may not be used by other sub-circuits within the system that the POR circuit operates. VIO is a known bias voltage in that it can be assumed to be both available and within +/−20% of its standard value prior to the power-up of VDD and continuously through the operation of the POR circuit.

Figure 1:
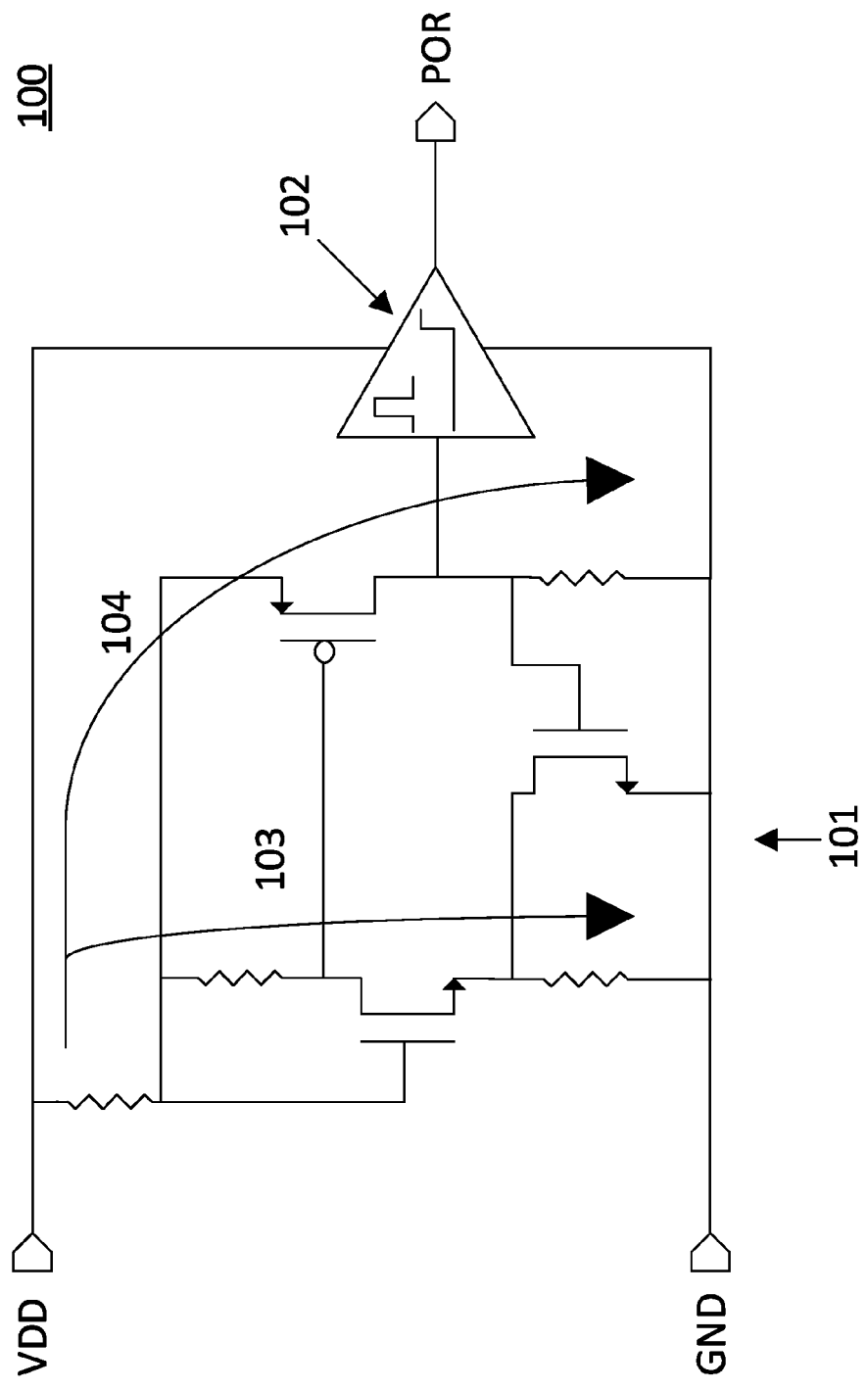
FIG. 1 illustrates a power on reset (POR) circuit that is in accordance with the related art.
Figure 2:
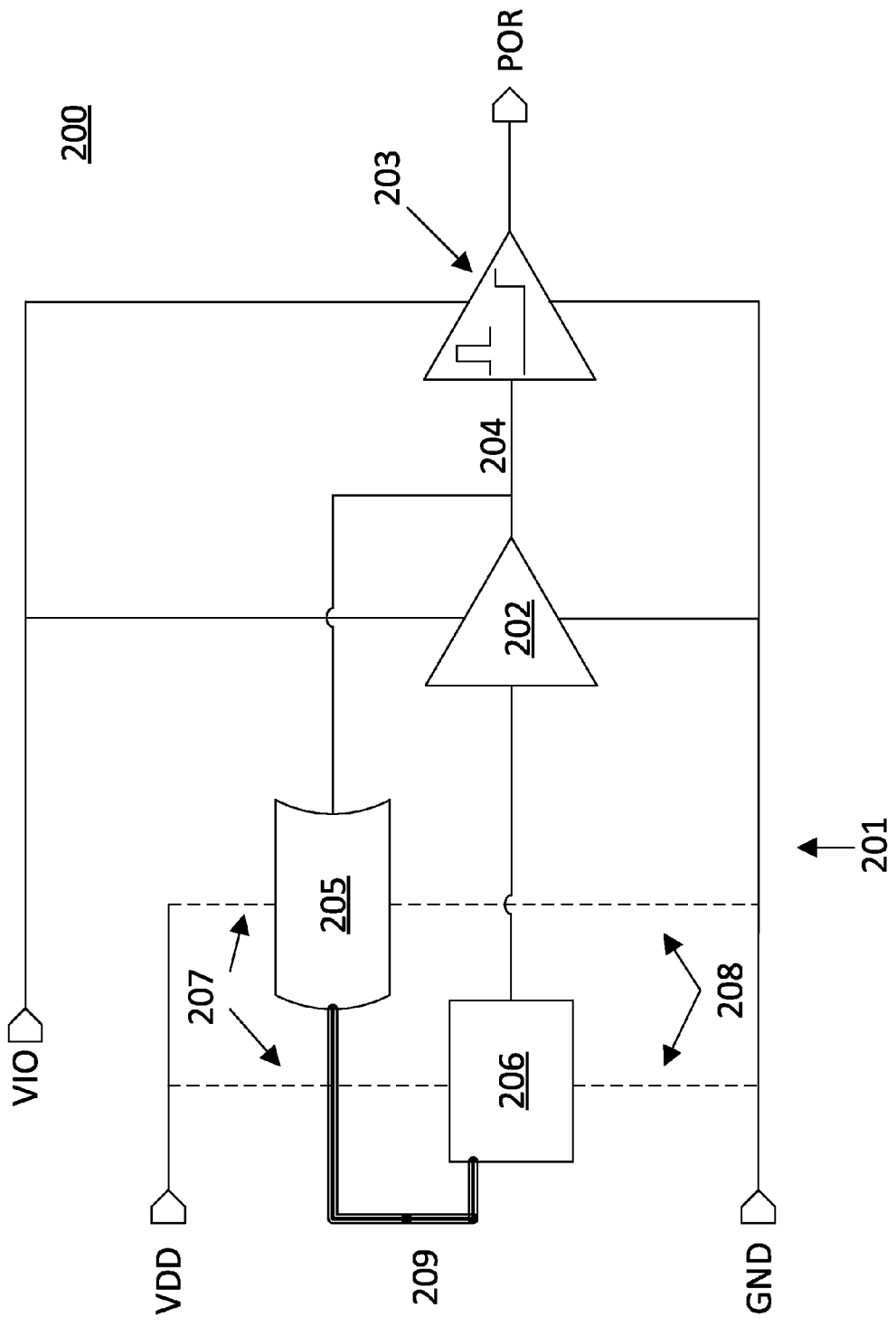
FIG. 2 illustrates a block diagram of a POR circuit that is in accordance with embodiments of the present invention.

An exemplary implementation of a POR circuit can be described with reference to FIG. 2. POR circuit 200 is illustrated as a block diagram that is in accordance with more specific circuits provided in the disclosure below. POR circuit 200 is a low power POR circuit for generating a POR signal upon detecting that a supply voltage has reached a desired level. In this particular situation, the supply voltage is the supply voltage of the overall circuit to which the POR circuit is a sub-circuit, VDD, and the desired level is a sufficient level for the other sub-circuits in the overall circuit to operate reliably. For example, the overall circuit could be an integrated circuit (IC) with multistate digital logic, and the sufficient level could be within 25% of a 3.3 volt (V) supply voltage such that the multistate digital logic does not get caught in a glitched state due to a low and noisy supply voltage. The sufficient level could also be the known bias voltage, VIO. In keeping with the previous example, VIO could be a 1.8 V voltage used by a printed circuit board on which the IC was located.

POR circuit 200 can also provide a hardware active stand-by signal on a circuit that is interfaced with a larger system. As a specific example, the circuit could be an antenna switch IC interfacing with a radio frequency (RF) front end using an MIPI specification compliant interface. The external voltage could be a system level voltage such as VIO and the supply voltage could be a local voltage used by the antenna switch IC. The POR signal could be generated as soon as the supply voltage exceeded VIO and could properly function as the hardware active stand-by signal to allow the antenna switch to transition safely into its regular operating condition. This is a particularly suitable implementation for certain approaches described herein due to the low stand-by state current requirements for VIO of the MIPI specification.

POR circuit 200 comprises a sense circuit 201 and a delayed buffer 203. Delayed buffer 203 generates a POR signal in response to a voltage transition on sense circuit output node 204. The delayed buffer 203 can also include an inversion operation and inverts the POR signal such that delayed buffer 203 is instead a delayed inverter and generates PORb instead of POR. The POR signal stays in its quiescent state for a given period of time after the voltage transition on sense circuit output node 204. The given period of time is determined by the properties of delayed buffer 203. The period of time is what provides the POR signal with its desired characteristic of remaining in a known state for a sufficient period of time after power-up in order for other sub-circuits to reach a stable operating state before commencing regular operation.

In operation, sense circuit 201 detects when a transition in supply voltage VDD has occurred and output node 204 experiences a resulting voltage transition when VDD has reached a desired level. Sense circuit 201 comprises: inverter 202, powered by VIO; and feedback circuit 205, powered by VDD. Feedback circuit 205 shuts off sense circuit 201 in response to the voltage transition on node 204. The POR signal is utilized by a local system to which POR circuit 200 is a part. VIO is provided by an external system that does not depend on the POR signal. For example, the local system could be an IC containing POR circuit 200 in which all sub-circuits rely on the POR signal provided by POR circuit 200, and the external system could be a printed circuit board providing a board-level power supply. In this example, VIO could be a 1.8 V supply that is available regardless of whether or not the IC is in a stand-by or active state while VDD could be a 3.3 V supply that is only provided when the IC is in an active or active-stand-by state.

POR circuit 200 further comprises a voltage divider 206 that provides a divided voltage to an input of inverter 202. Both feedback circuit 205 and voltage divider 206 are drawn coupled to VDD and ground by the two sets of phantom lines indicated by reference numerals 207 and 208. Voltage divider 206 is also drawn coupled to feedback circuit 205 via bus 209. Bus 209 represents multiple potential connections between feedback circuit 205 and voltage divider 206. The connections can be individual and independent wires in the circuit. Bus 209 can also comprise a single connection. The reason for the phantom lines and bus routing is that feedback circuit 205 and voltage divider 206 can each be coupled directly to VDD and GND and shunt the signal from either of those nodes to the other circuit block. All, three, or two of phantom lines 207 and 208 may be required to couple voltage divider 206 and feedback circuit 205 to a power supply and ground because each circuit block can provide a connection to neither, one, or both of nodes VDD and GND for the other circuit block. However, certain benefits accrue to approaches in which only one of lines 207 and 208 directly connect voltage divider 206 to VDD or GND and the other connection is provided via feedback circuit 205.

As long as feedback circuit 205 provides one of the connections to VDD or GND to voltage divider 206, feedback circuit 205 can shut off voltage divider 206 in response to the signal on inverter output node 204. For example, if feedback circuit 205 provides a path from voltage divider 206 to GND, feedback circuit 205 can isolate voltage divider 206 from ground in response to the signal on inverter output node 204. In situations where phantom lines 207 and 208 are both provided through feedback circuit 205, the feedback circuit could isolate voltage divider 206 from ground and also couple voltage divider 206 to the supply voltage in response to the signal on inverter output node 204. In certain approaches, shutting off voltage divider 206 using feedback circuit 205 will result in power not being drawn by sense circuit 201 once the system has reached a regular operating condition. In particular, since inverter 202 can be a two transistor CMOS inverter that does not consume power except for when it is transitioning, the entire sense circuit 201 can be set to consume zero power after the POR signal has been generated.

Voltage divider 206 can take on various forms. The voltage divider could be formed of integrated passive components such as resistors and be sized to present a fraction of VDD to the input of inverter 202. The voltage divider could also be formed using two transistors that are drain connected in saturation mode. For example, a p-type transistor and n-type transistor could be connected in series drain-to-drain at one node with their gates likewise coupled together at the same node. The use of resistors for voltage divider 206 would have the advantage of a better determination of voltage when VDD is very low (e.g., less than the threshold level of a transistor). However, transistors are advantageous for voltage divider 206 in situations in which inverter 202 comprises transistors because the POR switching threshold will be more reliable. This is because any variation in the switching point of inverter 202 and the behavior of voltage divider 206 due to process, voltage, and temperature variations will tend to cancel out.

The relative sizing of the devices in voltage divider 206 can be set to deliver a different voltage to the input of inverter 202 and therefore increase or decrease the sensitivity of the POR circuit. Increasing the impedance of the device coupled on the VDD side of the common node will decrease the voltage appearing at the input of inverter 202. In addition, any combination of passive resistors and transistors could be used to provide a voltage divider such as a saturation mode p-type transistor coupled to VDD and a resistor coupled between the input of inverter 202 and GND.

Figure 3:
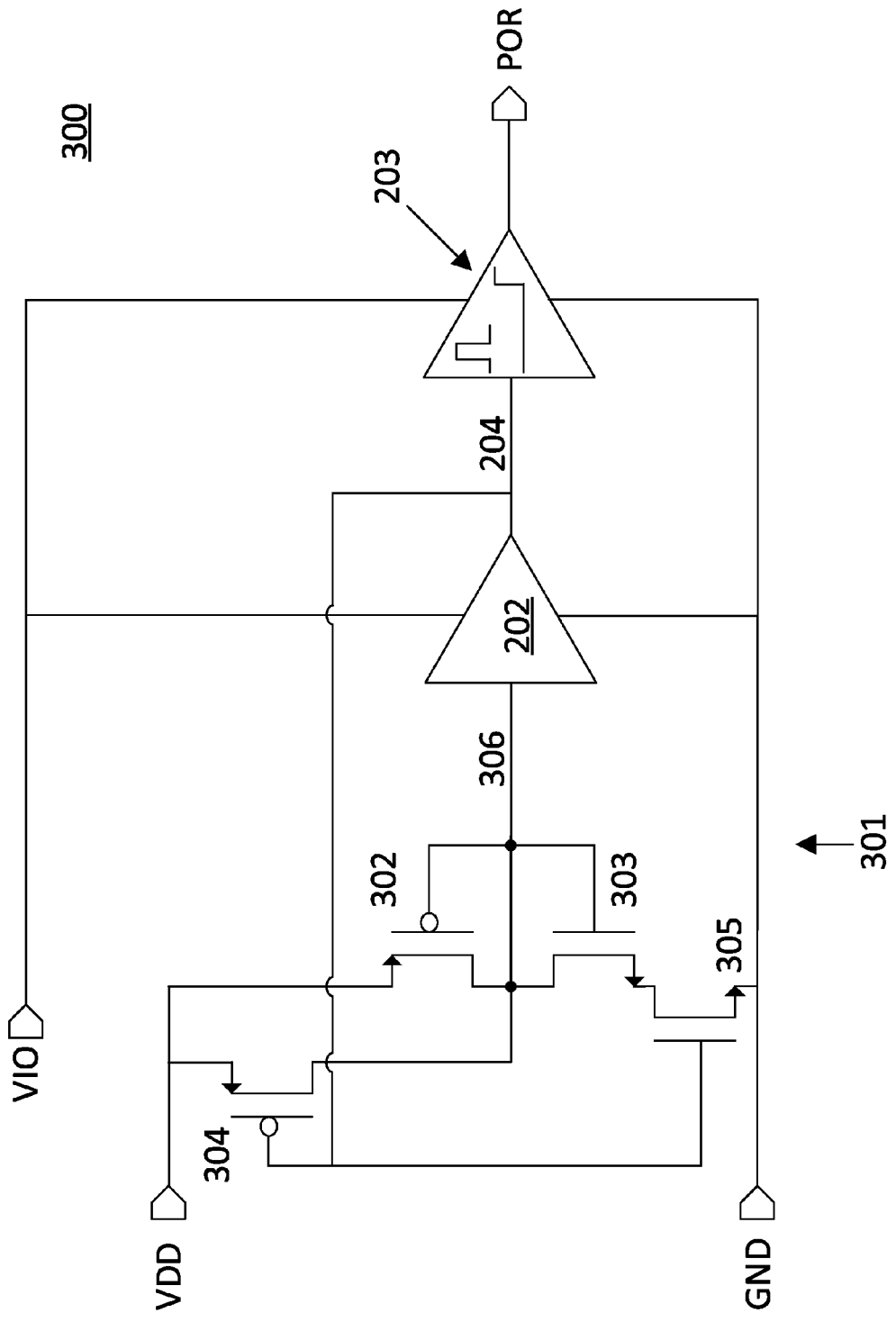
FIG. 3 illustrates a schematic of a POR circuit that is in accordance with embodiments of the present invention.

FIG. 3 illustrates a POR circuit 300 having a sense circuit 301 in which the voltage divider 206 comprises a first transistor 302 and a second transistor 303 that are coupled in series between VDD and GND. Transistor 302 is a p-type transistor and transistor 303 is an n-type transistor. First transistor 302 is gate coupled to the inverter input node of inverter 202 and provides a first source-drain path between VDD and the input of inverter 202. Second transistor 303 provides a second source-drain path along a circuit branch between the inverter input node and GND. The voltage divider serves to sense changes in VDD and provide them to the input of inverter 202.

In the implementation of POR circuit 200 illustrated by POR circuit 300, phantom lines 207 is implemented to directly connect first transistor 302 to VDD. In addition, feedback circuit 205 comprises transistors 304 and 305. Therefore, in this implementation, both branches of phantom lines 207 are implemented to directly connect their associated circuit blocks to VDD. Transistor 304 is gate coupled to the inverter output node 204 and provides a source-drain path between supply voltage VDD and inverter input node 306. Transistor 305 is also gate coupled to the inverter output node 204 and provides a source-drain path along the circuit branch between the second transistor 303 and GND. Transistor 305 will initially be in an on state with its gate at VIO because, with VDD powered down, the internal nodes of sense circuit 301 will be below VIO and inverter 202 will therefore be set to a low input and high output state. As such, transistor 305 will not interfere with the operation of the voltage divider during power-up.

The feedback circuit in sense circuit 301 is capable of both pulling the voltage divider to VDD via transistor 304 and isolating the voltage divider from ground via transistor 305. This is a beneficial approach in that the feedback circuit shuts off voltage divider 305 from consuming any power and also holds the internal nodes of voltage divider 206 at a set voltage so that none of the internal nodes can float to an unpredictable value. This benefit would be shared by any implementation in which the feedback circuit can isolate one side of the voltage divider from a power supply node and pull the internal nodes of the voltage divider to the other power supply node. The voltage divider does not need to be implemented using transistors to realize this benefit as transistors 302 and 303 could be replaced with resistors, and transistors 304 and 305 would still be able to shut off the resulting voltage divider.

Figure 4:
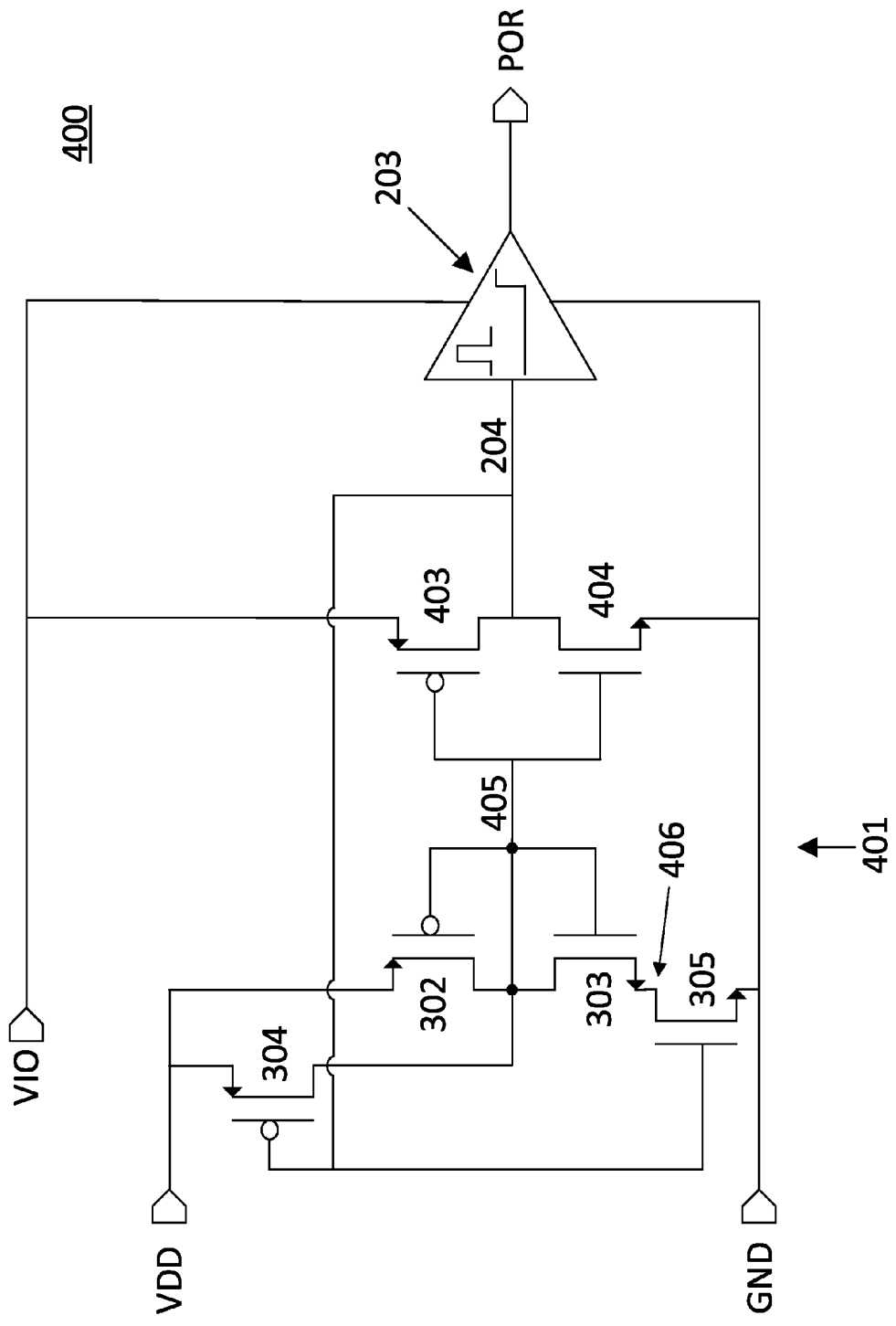
FIG. 4 illustrates a schematic of a POR circuit with a two transistor inverter that is in accordance with embodiments of the present invention

FIG. 4 illustrates POR circuit 400 that is similar in all respects to POR circuit 300 except that in sense circuit 401, the inverter is implemented as a third transistor 403 and a fourth transistor 404. Transistor 403 is source coupled to known bias voltage VIO. Transistor 404 is source coupled to GND. Transistors 403 and 302 can be sized equivalently and transistors 404 and 303 can be sized equivalently. As a result, the inverter formed by transistors 403 and 404 will be close to transitioning when the supply voltage VDD has reached VIO.

The relative sizing of transistors 302, 303, 403, and 404 can be adjusted to modify the switch point of POR sense circuit 401. In particular, transistor 303 can be made wider or shorter than transistor 404 in order to reduce the voltage at inverter input node 405 for a given VDD and thereby decrease the sensitivity of the sense circuit. In fact, as will be described in more detail below, the presence of transistor 305 will shift the switch point off of VDD being equal to VIO and making transistor 303 stronger will serve to counteract this shift. As another example, and perhaps to save area, the width-over-length values of transistors 403 and 404 may be multiples of the width-over-length values of transistors 302 and 303 in order to provide a stronger inverter that still tracks the voltage divider across process and temperature variations. To provide a uniform layout, transistors 403 and 404 could each comprise multiple fingers that have the same widths as the overall widths of transistors 302 and 303 respectively where transistors 302 and 303 are single finger transistors.

Figure 5:
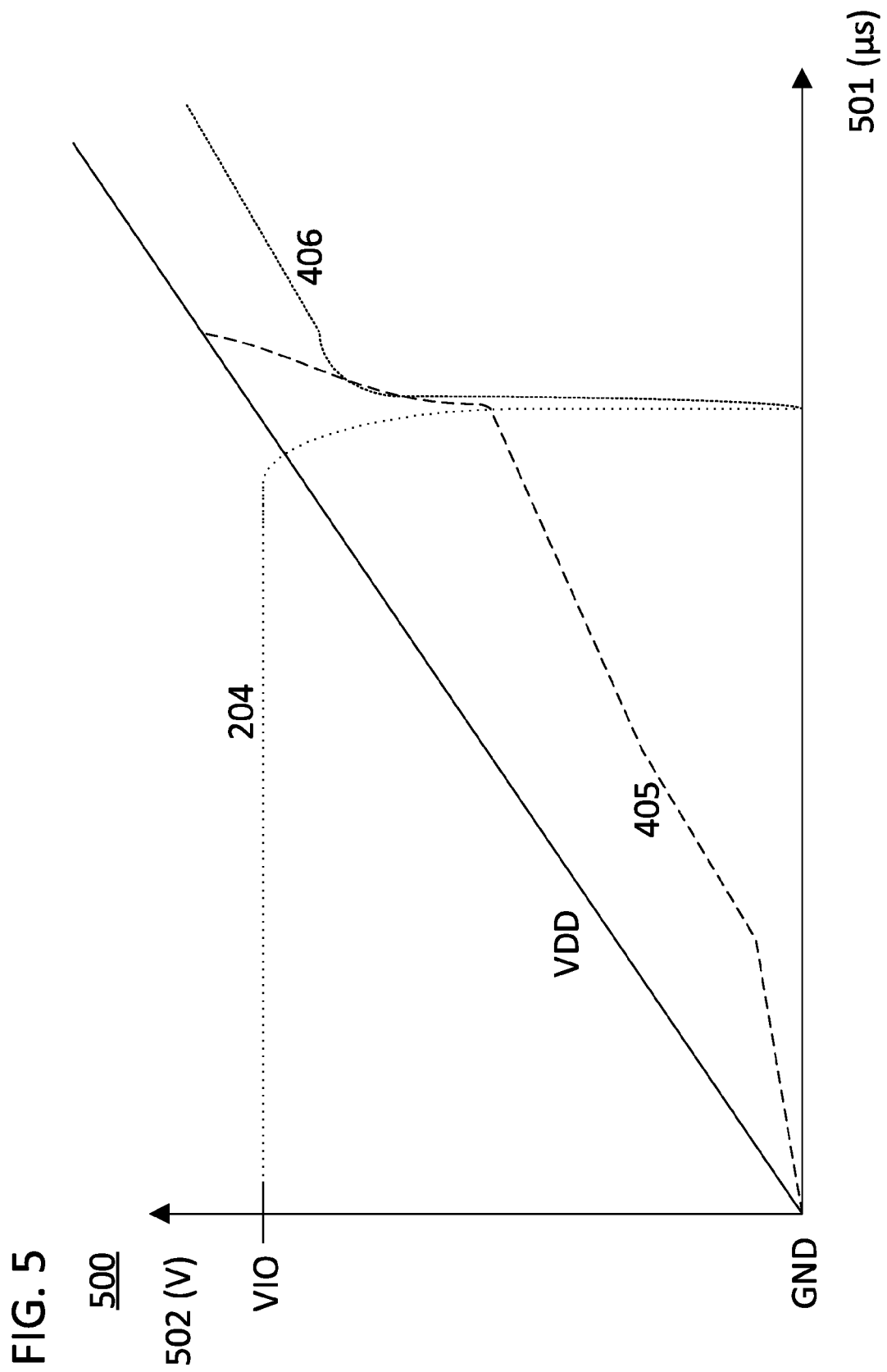
FIG. 5 illustrates a waveform plot of specific voltages from FIG. 4 with the x-axis in units of time and the y-axis in units of volts.

The operation of POR sense circuit 401 can be described with reference to the waveforms on graph 500 in FIG. 5. The x-axis 501 is in units of micro-seconds (μs) and the y-axis 502 is in units of volts. The known bias voltage VIO is marked on the y-axis with respect to the ground voltage GND. Before power-up, the internal nodes of sense circuit 401 such as inverter input node 405 and node 406 are low at GND. As a result, inverter output node 204 is high at VIO. As VDD begins to rise, inverter input node 405 begins to rise as transistors 302 and 303 divide VDD to produce the voltage on inverter input node 405. This rise in voltage will begin to activate transistor 404 and start to pull down inverter output node 204. As VDD continues to rise, the inverter will reach its switching point.

The switching point of the inverter is produced on node 405 at approximately the point at which VDD is equal to VIO—the switching point of an inverter is generally defined as the point at which the input equals the output. Also, since both transistors 403 and 404 in the inverter will be in saturation at the switching point, and transistors 302 and 303 are connected in saturation mode, the voltage divider and inverter of sense circuit 401 will be at their switching points when the transistor nodes are each biased with near identical voltages. Ignoring the effect of transistor 305, that near identical bias situation results when VDD is equal to VIO. Therefore, the switching point of the inverter is approximately the point at which VDD is equal to VIO. Transistor 305 will have some effect on the switching point because its gate voltage begins to drop from VIO as the inverter begins to switch on. This will cause the source of transistor 303 to be at a higher voltage than the source of transistor 404 and will therefore weaken transistor 303 relative to transistor 404. To counteract this affect, and as described above, transistor 303 can be sized to be slightly stronger than transistor 404.

When the inverter switches on, inverter output node 204 will drop to GND. The feedback circuit provides positive feedback to this transition as transistor 304 will pull inverter input node 405 up all the way to VDD and isolate the voltage divider from ground by turning off transistor 305. This results in positive feedback because both of the transitions to devices 304 and 305 increase the rate at which inverter input node 405 will approach VDD. In addition to positive feedback, the transitions on devices 304 and 305 serve to isolate the voltage divider from ground so that it does not consume power once the sense circuit has detected a transition in VDD to a sufficient voltage. In addition, the inverter in circuit 400 does not consume power after it has transitioned because device 403 will be completely off. As a result, once the inverter has completely transitioned, inverter output node 204 will be at ground and the sense circuit 401 will not draw any current. Therefore, the transition on inverter output node 204 indicates the detection of VDD reaching a sufficient level and also serves to turn off POR sense circuit 401.

Once the sense circuit 201 has detected a transition in the supply voltage to a sufficient level, delayed buffer 203 will generate the required POR signal in response to a transition in the signal on sense circuit output node 204. As mentioned previously, a POR signal must guarantee a stable reset signal for some reasonable length of time after the supply voltage has risen high enough that the other sub-circuits in the system will be able to react properly to the reset and reach a stable operating state. Since the power supply rise time is generally an unspecified parameter that a circuit designer must accept as an external constraint, the POR circuit has to guarantee the stable reset signal regardless of how fast the power supply powers-up. For example, it should work for rapid supply rise times (e.g., hot-plugged applications) and should also work for slow rise times (e.g., a DC ramp).

Figure 6:
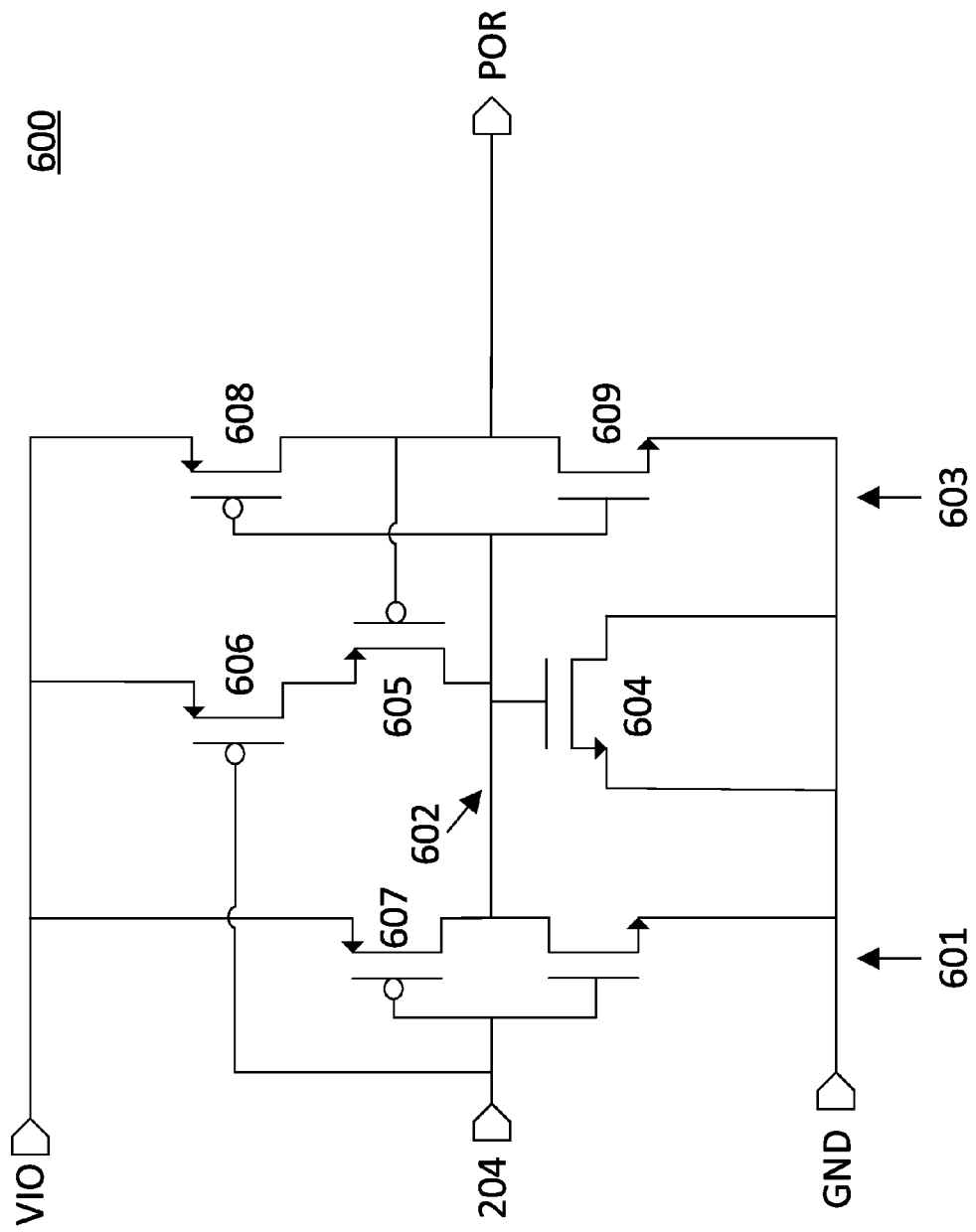
FIG. 6 illustrates a schematic of a POR delay buffer that is in accordance with embodiments of the present invention.

An exemplary delayed buffer circuit 600 that can be used in place of delayed buffer 203 is illustrated in FIG. 6. As drawn, delayed buffer circuit 600 is connected to inverter output node 204 and generates the POR signal on the node marked POR. The circuit is powered by VIO and is coupled to GND. Circuit 600 comprises a first sub-inverter 601 that is input coupled to inverter output node 204 and output coupled to capacitive delay node 602. Circuit 600 also comprises a second sub-inverter 603 that is input coupled to capacitive delay node 602 and output coupled to a second sub-inverter output node. In this figure, the second sub-inverter output node is the node marked POR. Having these two inverters back to back results in a signal at the second sub-inverter output node that has the same polarity as the signal input to circuit 600. The resulting signal is the POR signal and it goes to the known bias voltage VIO in response to a voltage transition on the output node of the sense circuit. The difference between the POR signal and the signal on inverter output node 204 is that the POR signal takes longer to express the transition that occurs on inverter output node 204.

The period of time between when the input of circuit 600 transitions to when the output of circuit 600 transitions can be referred to as the delay period of the delayed buffer, and it is a value that is set by capacitive delay element 604 coupled to capacitive delay node 602. Typical values for the delay period in a standard IC are on the order of 5 μs. Capacitive delay element 604 is drawn as a source-drain shorted transistor that is gate coupled to capacitive delay node 602, source coupled to the ground node, and drain coupled to the ground node. In this situation, the capacitor can be formed by standard transistor processing steps where the width and length of the gate set the capacitance of the delay element. In the alternative, capacitive delay element 604 can instead by a capacitor fabricated according to alternative processing steps. For example, the capacitor could be a metal-insulator-metal capacitor build after the transistors of circuit 600 have been formed. The capacitor could also be a capacitor formed using alternative integrated passive processing steps.

Circuit 600 includes two additional transistors that help to make the overall circuit less susceptible to brown outs and other perturbations on the supply voltage. These transistors achieve this result by introducing a degree of hysteresis to the inverter. First transistor 606 is gate coupled to the inverter output node, and source coupled to VIO. Second transistor 605 is gate coupled to the second sub-inverter output node and drain coupled to capacitive delay node 602. A drain of first transistor 606 is coupled to a source of second transistor 605. These transistors serve to force the delay buffer on after it the delay period has passed. Transistors 606 and 605 do not have a path to ground when the circuit is outputting a low value because the n-type transistor in sub-inverter 601 is off. Therefore, they do not consume power after the POR signal has been generated.

Other enhancement to circuit 600 can be realized through sizing the individual transistors that comprise the circuit and making similar modifications to the transistors. For example, transistor 607 can be designed to have a high threshold voltage and a long channel such that it provides a slow charge to capacitive delay node 602 and thereby increases the delay period for a set capacitor size. As another example, transistor 608 can be designed to have a relatively large width and small length and transistor 609 can be designed to have an opposite characteristic which will give sub-inverter 603 a high switching threshold. This sizing selection will also provide a snappier transition of the POR signal and minimize the amount of time spent in which an open circuit is provided between VIO and GND through sub-inverter 603. This is beneficial given that the input voltage to sub-inverter 603 is ramped slowly on purpose which could otherwise result in a long time period in which sub-inverter 603 was in a transitioning state and burning current directly from VIO to GND.

The behavior of the POR signal as influenced by circuit 600 can be described with reference to the waveforms on graph 700 in FIG. 7. The x-axis 701 is in units of μs and the y-axis 702 is in units of volts. VDD is illustrated using waveform 703 and rises from GND, exceeds VIO, and then returns to GND. Waveform 704 is an inverse of the POR signal and results from inverting the signal on node POR in FIG. 6. The delay period 705 is illustrated by a bracket and is drawn with the assumption that the sense circuit switches precisely at the point where VDD passes VIO. Waveform 704 remains low for the period of time necessary for the other sub-circuits in the overall system to reach a stable operating state. Waveform 704 also illustrates the hysteresis characteristics of the POR circuit in that it transitions from high to low at a different value for VDD as compared to when it transitions from low to high. This characteristic is a large part of what makes the POR circuit immune to brown outs on the supply voltage.

A POR circuit should have good immunity to noise on, or brown outs of, the power supply voltage. This characteristic will avoid accidental resets of the system during operation which can be fatal for performance considerations. Delay buffer 600 provides a good degree of immunity to these factors as illustrated by the waveforms in graph 800 in FIG. 8. The waveforms were obtained from the simulation of a sense circuit in accordance with sense circuit 401 and a delay buffer in accordance with delay buffer 600. The known bias voltage VIO was 1.8 V and the full power VDD was 3.6 V.

Graph 800 includes two sets of x-axes, 801 and 804, that are in units of μs and are aligned on the page to indicate that any point on x-axis 801 correlates in time with any point that is directly below that point on x-axis 804. Y-axis 802 and y-axis 805 are in unit of volts. Waveform 804 charted on y-axis 805 is the same inverse POR signal from FIG. 7 but it is responding to a separate variation pattern of VDD that is charted on y-axis 802 as waveform 803. Waveform 803 begins with a slow DC ramp and is followed by three brown outs of roughly 25 μs and 1.4 V, 2 V, and 3.1 V for a 3.6 V supply. Notably, the inverse POR signal 804 does not respond to the brown outs until the final drop of 3.1 V.

Although some embodiments of circuit 200 in the above disclosure were specifically illustrated with reference to field effect transistors and particular topologies, alternative transistor technologies and circuit topologies could be used instead. Indeed, any technology could benefit from the teachings herein including bipolar junction transistors, cross bar transistors, and any other transistor technology. Furthermore, certain topology modifications provide benefits not available to the specific topologies discussed above. For example, the feedback circuit could be driven from a later stage such as the output of delay buffer 203 or the internal capacitive delay node 605 of delay buffer 600. This approach would provide certain benefits in that transistor 305 would not alter the switching point of the sense circuit (since transistor 305 would stay on until after the inverter switched, transistors 302, 303, 403, and 404 would see approximately the same voltages while sense circuit 401 was sensing a transition). However, this topology would also lead to larger current consumed through transistors 302 and 303 because it would take longer for transistor 305 to switch and isolate the sense circuit from ground. Numerous other topologies in keeping with circuit 200 could be applied with their own benefits and drawbacks.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A power-on-reset circuit for generating a power-on-reset signal upon detecting that a supply voltage has reached a desired level comprising:
a sense circuit comprising: (i) an inverter powered by a known bias voltage; (ii) a feedback circuit powered by the supply voltage; and (iii) an output node of the sense circuit that experiences a voltage transition when the supply voltage has reached the desired level; and
a delayed buffer coupled to the output node of the sense circuit that generates the power-on-reset signal in response to the voltage transition;
wherein the feedback circuit shuts off the sense circuit in response to the voltage transition;
wherein the power-on-reset circuit generates the power-on-reset signal for a local system; and
wherein the known bias voltage is provided by an external system;
the sense circuit further comprising: a voltage divider coupled to the supply voltage and providing a divided voltage to an inverter input node; wherein the inverter comprises an inverter output node and the inverter input node; and wherein the inverter output node is the output node of the sense circuit;
the voltage divider comprising: a first transistor that is gate coupled to the inverter input node, and that provides a first source-drain path between the supply voltage and the inverter input node; and a second transistor that is gate coupled to the inverter input node, and that provides a second source-drain path along a circuit branch between the input of the inverter and a ground node.

2. The power-on-reset circuit of claim 1, the inverter comprising:
a third transistor that is source coupled to the known bias voltage; and
a fourth transistor that is source coupled to the ground node; wherein the first and third transistors are sized equivalently; and
wherein the second transistor has one of: a width that is wider than the fourth transistor and a length that is shorter than the fourth transistor.

3. The power-on-reset circuit of claim 1, the feedback circuit comprising:
a fifth transistor that is gate coupled to the inverter output node and that provides a fifth source-drain path between the supply voltage and the inverter input node; and
a sixth transistor that is gate coupled to the inverter output node and that provides a sixth source-drain path along the circuit branch between the second transistor and the ground node.

4. A power-on-reset circuit for generating a power-on-reset signal upon detecting that a supply voltage has reached a desired level comprising:
a sense circuit comprising: (i) an inverter powered by a known bias voltage; (ii) a feedback circuit powered by the supply voltage; and (iii) an output node of the sense circuit that experiences a voltage transition when the supply voltage has reached the desired level; and
a delayed buffer coupled to the output node of the sense circuit that generates the power-on-reset signal in response to the voltage transition;
wherein the feedback circuit shuts off the sense circuit in response to the voltage transition;
wherein the power-on-reset circuit generates the power-on-reset signal for a local system; and
wherein the known bias voltage is provided by an external system, the delayed buffer comprising:
a first sub-inverter that is input coupled to the output node of the sense circuit, and output coupled to a capacitive delay node;
a second sub-inverter that is input coupled to the capacitive delay node, and output coupled to a second sub-inverter output node;
a first transistor that is gate coupled to the inverter output node, and source coupled to the known bias voltage;

a second transistor that is gate coupled to the second sub-inverter output node and drain coupled to the capacitive delay node; and a capacitive delay element coupled to the capacitive delay node;

wherein a drain of the first transistor is coupled to a source of the second transistor; and wherein a delay period of the delayed buffer is set by the capacitive delay element.

5. The power-on-reset circuit of claim 4, wherein:

the power-on-reset signal rises to the known bias voltage in response to the voltage transition on the output node of the sense circuit after the delay period; and the power-on-reset circuit is immune to brown outs on the supply voltage.

6. A power-on-reset circuit:

an inverter that is powered by an external power source and that outputs a signal when a supply voltage exceeds the external power source;

a delayed buffer that is operatively coupled to an inverter output node of the inverter to receive the signal from the inverter;

a feedback circuit; and a voltage divider coupled to the supply voltage, an inverter input node of the inverter, and the feedback circuit;

wherein the feedback circuit isolates the voltage divider from ground and couples the voltage divider to the supply voltage in response to the signal; and wherein the delayed buffer generates a power-on-reset signal in response to the signal, the voltage divider further comprising:

a first transistor that is gate coupled to the inverter input node, and that provides a first source-drain path between the supply voltage and the inverter input node; and a second transistor that is gate coupled to the inverter input node, and that provides a second source-drain path along a circuit branch between the input of the inverter and a ground node.

7. The power-on-reset circuit of claim 6, the inverter comprising:

a third transistor that is source coupled to the external power source; and a fourth transistor that is source coupled to the ground node;

wherein the first and third transistors are sized equivalently; and wherein the second transistor has one of: a width that is wider than the fourth transistor and a length that is shorter than the fourth transistor.

8. The power-on-reset circuit of claim 6, the feedback circuit comprising:

a fifth transistor that is gate coupled to the inverter input node and that provides a fifth source-drain path between the supply voltage and the inverter input node; and a sixth transistor that is gate coupled to the inverter output node and that provides a sixth source-drain path along the circuit branch between the second transistor and the ground node.

9. A power-on-reset circuit:

an inverter that is powered by an external power source and that outputs a signal when a supply voltage exceeds the external power source;

a delayed buffer that is operatively coupled to an inverter output node of the inverter to receive the signal from the inverter;

a feedback circuit; and a voltage divider coupled to the supply voltage, an inverter input node of the inverter, and the feedback circuit;

wherein the feedback circuit isolates the voltage divider from ground and couples the voltage divider to the supply voltage in response to the signal; and wherein the delayed buffer generates a power-on-reset signal in response to the signal, the voltage divider further comprising: a first resistor coupled between the external power source and the inverter input node; and a second resistor forming a conductive path on a circuit branch between the inverter input node and a ground node, the feedback circuit comprising:

a first transistor that is gate coupled to the inverter output node and that provides a first source-drain path between the supply voltage and the inverter input node; and a second transistor that is gate coupled to the inverter output node and that provides a second source-drain path along the circuit branch between the second resistor and the ground node.

10. A power-on-reset circuit:

an inverter that is powered by an external power source and that outputs a signal when a supply voltage exceeds the external power source;

a delayed buffer that is operatively coupled to an inverter output node of the inverter to receive the signal from the inverter;

a feedback circuit; and a voltage divider coupled to the supply voltage, an inverter input node of the inverter, and the feedback circuit;

wherein the feedback circuit isolates the voltage divider from ground and couples the voltage divider to the supply voltage in response to the signal; and wherein the delayed buffer generates a power-on-reset signal in response to the signal, the delayed buffer comprising:

a first sub-inverter that is input coupled to the inverter output node and output coupled to a capacitive delay node;

a second sub-inverter that is input coupled to the capacitive delay node, and output coupled to a second sub-inverter output node;

a first transistor that is gate coupled to the inverter output node, and source coupled to the external power source;

a second transistor that is gate coupled to the second sub-inverter output node and drain coupled to the capacitive delay node; and a capacitive delay element coupled to the capacitive delay node;

wherein a drain of the first transistor is coupled to a source of the second transistor; and wherein a delay period of the delayed buffer is set by the capacitive delay element.

11. The power-on-reset circuit of claim 10, wherein:

the delay period of the delayed buffer is set by the capacitive delay element;

the power-on-reset signal goes to a voltage level of the external power source in response to the signal on the inverter output node after the delay period; and the power-on-reset circuit is immune to brown outs on the supply voltage.

12. A power-on-reset circuit comprising:

an inverter coupled between a known bias voltage and a ground node;

a first transistor that is coupled between a supply voltage and an input node of the inverter and that has a first control electrode coupled to the input node of the inverter;

a second transistor that forms a portion of a circuit branch between the first transistor and the ground node and that has a second control electrode coupled to the input node of the inverter;

a delayed buffer that receives a transition signal from the inverter when the supply voltage exceeds the known bias voltage; and a feedback circuit that shorts the circuit branch and pulls the input node of the inverter to the supply voltage in response to the transition signal, the feedback circuit further comprising:

a third transistor that is gate coupled to an output node of the inverter and that forms a first source-drain path between the supply voltage and the input node of the inverter;

a fourth transistor that is gate coupled to the output node of the inverter and that forms a second source-drain path between the second transistor and the ground node along the circuit branch.

13. A power-on-reset circuit comprising:

an inverter coupled between a known bias voltage and a ground node;

a first transistor that is coupled between a supply voltage and an input node of the inverter and that has a first control electrode coupled to the input node of the inverter;

a second transistor that forms a portion of a circuit branch between the first transistor and the ground node and that has a second control electrode coupled to the input node of the inverter;

a delayed buffer that receives a transition signal from the inverter when the supply voltage exceeds the known bias voltage; and a feedback circuit that shorts the circuit branch and pulls the input node of the inverter to the supply voltage in response to the transition signal, the delayed buffer comprising:

a delayed buffer input node coupled to the output node of the inverter;

a first sub-inverter that has a first sub-inverter input coupled to the delayed buffer input node and a first sub-inverter output coupled to a delay node;

a second sub-inverter that has a second sub-inverter input coupled to the delay node; and a delay element coupled between the delay node and the ground node that sets the delay of the delayed buffer.

14. A power-on-reset circuit comprising:

an inverter coupled between a known bias voltage and a ground node;

a first transistor that is coupled between a supply voltage and an input node of the inverter and that has a first control electrode coupled to the input node of the inverter;

a second transistor that forms a portion of a circuit branch between the first transistor and the ground node and that has a second control electrode coupled to the input node of the inverter;

a delayed buffer that receives a transition signal from the inverter when the supply voltage exceeds the known bias voltage; and a feedback circuit that shorts the circuit branch and pulls the input node of the inverter to the supply voltage in response to the transition signal, the feedback circuit further comprising:

a third transistor that is gate coupled to the delay node and that forms a first source-drain path between the supply voltage and the input node of the inverter;

a fourth transistor that is gate coupled to the delay node and that forms a second source-drain path between the second transistor and the ground node along the circuit branch.

15. The power-on-reset circuit of claim 13, wherein:

the delay element is a source-drain shorted transistor that is gate coupled to the delay node, source coupled to the ground node, and drain coupled to the ground node.

* * * * *